United States Patent
Lee et al.

(10) Patent No.: US 11,049,918 B2
(45) Date of Patent: Jun. 29, 2021

(54) ORGANIC LIGHT EMITTING DISPLAY DEVICE AND METHOD OF FABRICATING THEREOF

(71) Applicant: LG Display Co., Ltd., Seoul (KR)

(72) Inventors: Hak-Min Lee, Paju-si (KR); Nack-Youn Jung, Paju-si (KR); Hee-Jin Kim, Paju-si (KR); Myung-O Joo, Paju-si (KR); Sung-Soo Park, Paju-si (KR); Jeong-Mook Choi, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/705,007

(22) Filed: Dec. 5, 2019

(65) Prior Publication Data

US 2020/0185471 A1 Jun. 11, 2020

(30) Foreign Application Priority Data

Dec. 11, 2018 (KR) .................. 10-2018-0159151

(51) Int. Cl.
*H01L 27/32* (2006.01)
*H01L 51/52* (2006.01)

(52) U.S. Cl.
CPC ...... *H01L 27/3246* (2013.01); *H01L 27/3211* (2013.01); *H01L 51/5237* (2013.01); *H01L 2251/558* (2013.01)

(58) Field of Classification Search
CPC ............. H01L 27/3246; H01L 27/3211; H01L 27/3295; H01L 27/3833; H01L 51/5237; H01L 51/525
See application file for complete search history.

(56) References Cited

U.S. PATENT DOCUMENTS

| | | | |
|---|---|---|---|
| 8,338,222 B2 | 12/2012 | Kim et al. | |
| 8,604,495 B2 | 12/2013 | Matsushima | |
| 2003/0127657 A1* | 7/2003 | Park .................. | H01L 27/3246 257/79 |
| 2005/0196893 A1 | 9/2005 | Kim et al. | |

(Continued)

FOREIGN PATENT DOCUMENTS

| | | | |
|---|---|---|---|
| KR | 10-2005-0082652 A | 8/2005 | |
| KR | 10-2013-0073012 A | 7/2013 | |
| WO | WO-2012132862 A1 * | 10/2012 | ......... H01L 27/3216 |

*Primary Examiner* — Dale E Page
*Assistant Examiner* — Quovaunda Jefferson
(74) *Attorney, Agent, or Firm* — Fenwick & West LLP

(57) ABSTRACT

An organic light emitting display device and method of fabricating thereof is disclosed. The organic light emitting display device comprises a first substrate; a plurality of first bank layers arranged along a first direction and a second direction on the first substrate to define a plurality of pixels, where the first direction and the second direction are orthogonal; a plurality of second bank layers disposed along the first direction on the first bank layers to divide pixels columns of different colors; and an organic light emitting diode in each pixel, the organic light emitting diode including an organic light emitting layer having different thicknesses on different colored pixels, wherein the side surfaces of the second bank layer adjacent to the pixel columns of different colors are inclined, the inclined angle thereof is dependent upon a thickness of the organic light emitting layer in the pixel.

11 Claims, 7 Drawing Sheets

(56) References Cited

U.S. PATENT DOCUMENTS

| | | | |
|---|---|---|---|
| 2007/0138943 A1* | 6/2007 | Tano | H01L 51/56 313/503 |
| 2007/0228367 A1* | 10/2007 | Nakamura | H01L 51/5265 257/40 |
| 2011/0180821 A1* | 7/2011 | Matsushima | H01L 27/3246 257/88 |
| 2012/0091483 A1 | 4/2012 | Matsushima | |

* cited by examiner $a1 = a2 = a3$
$\theta1 > \theta2 > \theta3$
$b1 > b2 > b3$

ORGANIC LIGHT EMITTING DISPLAY DEVICE AND METHOD OF FABRICATING THEREOF

CROSS-REFERENCE TO RELATED APPLICATIONS

This application claims priority to Republic of Korea Patent Application No. 10-2018-0159151, filed on Dec. 11, 2018, the disclosure of which is incorporated herein by reference in its entirety.

BACKGROUND

1. Field of Technology

The disclosure is related to light emitting display device and a method of fabrication thereof, more particularly to the light emitting display device having an organic light emitting layer having uniform thickness for each pixel.

2. Description of Related Art

Recently, various thin flat panel display devices have been developed to reduce weight and volume of the display device. As one of these flat panel display devices, the organic light emitting display device which the organic light emitting layer emitting the light by itself has advantages such as fast response speed, high luminous efficiency, luminance, and wide viewing angle.

The organic light emitting layer is made of an organic light emitting material and formed by a thermal evaporation process. However, the thermal evaporation process has the following problems.

In the thermal evaporation process, a metal mask is disposed on the front surface of the substrate to block a non-display region and then evaporate the organic light emitting material to deposit the organic light emitting material on the substrate. Thus, there are many depositing processes such as a dispose and an alignment of the metal mask, evaporation of the organic light emitting material, and a removal of the metal layer to form the organic light emitting layer, so that, the fabricating process is complicated, the fabricating process is delayed, and the fabricating cost is increased.

Further, an aligning device should be used to correctly align the metal mask to avoid the defective organic light emitting layer caused by the misalignment of the metal mask. Since the thermal evaporation device is enlarged according to the enlargement of the display device, in addition, the fabricating cost is further increased. Even when the display device becomes larger than a certain size, thermal evaporation becomes practically impossible.

SUMMARY

An object of the disclosure is to provide the organic light emitting display device and method of fabricating thereof that can be the fast and large size processes by depositing the organic light emitting layer with coating process.

Another object of the disclosure is to provide the organic light emitting display device and method of fabricating thereof having an organic light emitting layer having uniform thickness by controlling inclined angles of side surfaces of a second bank layer in accordance with a coating thickness of an organic light emitting material coated in pixels.

In order to achieve these objects, the organic light emitting display device comprises a first substrate; a plurality of first bank layers arranged along a first direction and a second direction on the first substrate to define a plurality of pixels, where the first direction and the second direction are orthogonal; a plurality of second bank layers disposed along the first direction on the first bank layers to divide pixel columns of different colors; and an organic light emitting diode in each pixel, the organic light emitting diode including an organic light emitting layer having different thicknesses on different colored pixels, wherein the side surfaces of the second bank layer adjacent to the pixel columns of different colors are inclined, the inclined angle thereof is dependent upon a thickness of the organic light emitting layer in the pixel.

A plurality of pixels include red, green, and blue pixels, and the relationship of the thickness t1 of the organic light emitting layer in the red pixel, the thickness t2 of the organic light emitting layer in the green pixel, and the thickness t3 of the organic light emitting layer in the blue pixel is t1>t2>t3.

The second bank layer has the width smaller than that of the first bank layer to expose a part of the first bank layer and the organic light emitting layer is disposed on the exposed area of the first bank layer. The second bank layer may be formed to have the same width as that of the first bank layer. The first bank layer is made of hydrophilic material and the second bank layer is made of hydrophobic material.

The size of the luminescent areas of pixels of different colors are different, and the inclined angle of the side surface of the second bank layer is dependent upon the thickness of the organic light emitting layer and the size of the luminescent area in the pixel.

Further, a method of fabricating an organic light emitting display device comprises forming a plurality of first bank layers along a first direction and a second direction on a substrate to define a plurality of pixels and a plurality of second bank layers along the first direction on the first bank layers to divide pixel columns of different colors, where the first direction and the second direction are orthogonal; forming a first electrode in the pixel; coating an organic light emitting material in each of the pixel columns; and drying the organic light emitting material to form an organic light emitting layer, wherein the side surfaces of the second bank layer adjacent to the pixel columns of different colors are inclined, the inclined angle thereof is dependent upon a thickness of the organic light emitting layer in the pixel.

The organic light emitting material is melted in a solvent, and the relationship between the viscosity CP1 of the Red organic light emitting material, the viscosity CP2 of the Green organic light emitting material, and the viscosity CP3 of the Blue organic light emitting material is CP1>CP2>CP3.

DETAILED DESCRIPTION

The advantages and the features of the present disclosure and the method of achieving them will become apparent with reference to the embodiments described in detail below together with the accompanying drawings. The present disclosure may, however, be embodied in many different forms and should not be limited to the embodiments disclosed below. Rather, these embodiments are provided so that this disclosure of the present disclosure will be complete, and will fully convey the scope of the invention to those skilled in the art to which the present invention pertains, and the present invention is merely defined by the scope of claims.

Hereinafter, the disclosure will be described in detail accompanying drawings. In this disclosure, the coating process is used to form the organic light emitting layer of the organic light emitting display device, not used by the thermal evaporation process. In this disclosure, that is, the organic light emitting material is dropped in the predetermined area and then the dropped organic light emitting material is spread out on the substrate to form the organic light emitting layer. Comparing to the organic light emitting layer formed by the thermal evaporation process, thus, the organic light emitting layer can be simply and rapidly formed. Further, the organic light emitting display device having large size can be fabricated.

In particular, since an inclined angle of the bank layer or dry surface area for drying the organic light emitting material is varied according to the R, G, B pixels, the thickness unevenness of the organic light emitting layer caused by the difference in the drying speed according to the coating thickness of the organic light emitting material for each R, G, B pixels can be solved.

Figure 1:
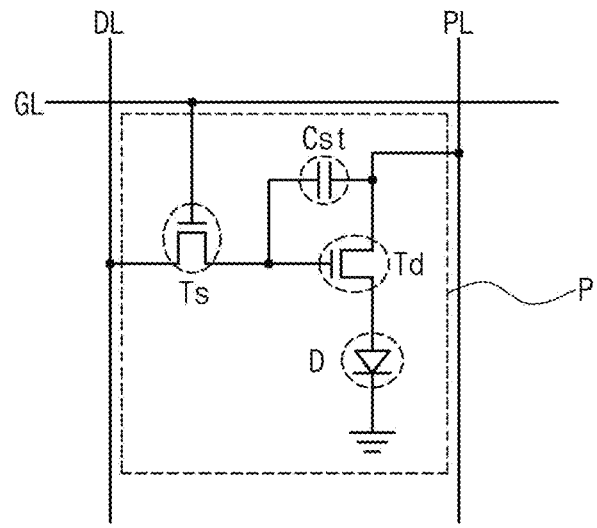
FIG. 1 is a schematic circuit of the organic light emitting display device according to one embodiment of the disclosure.

FIG. 1 is a schematic circuit of the organic light emitting display device according to the disclosure.

As shown in FIG. 1, the organic light emitting display device includes a plurality of gate lines GL and data lines DL, which are cross each other to define a plurality of pixels P, and a plurality of power lines PL. In each of the pixels P, a switching thin film transistor Ts, a driving thin film transistor Td, a storage capacitor Cst, and an organic light emitting diode D are provided.

The switching thin film transistor Ts is connected to the gate line GL and the data line DL. The driving thin film transistor Td and the storage capacitor Cst are disposed between the switching thin film transistor Ts and the power line PL. The organic light emitting diode D is connected to the driving thin film transistor Td.

In this organic light emitting display device, the switching thin film transistor Ts is turned on by the gate signal applied to the gate line GL and then the data signal applied to the data line DL is supplied to the gate electrode of the driving thin film transistor Td and the one electrode of the storage capacitor Cst through the switching thin film transistor Ts.

The driving thin film transistor Td is turned on by the data signal applied to the gate electrode. Thus, the current proportion to the data signal is supplied to the organic light emitting diode D from the power line PL through the driving thin film transistor Td so that the organic light emitting diode D emits the light of luminance proportion to the current through the driving thin film transistor Td.

At this time, the data voltage proportion to the data signal is charged in the storage capacitor Cst, so that the gate voltage of driving thin film transistor Td is uniformly kept during one frame.

Figure 2:
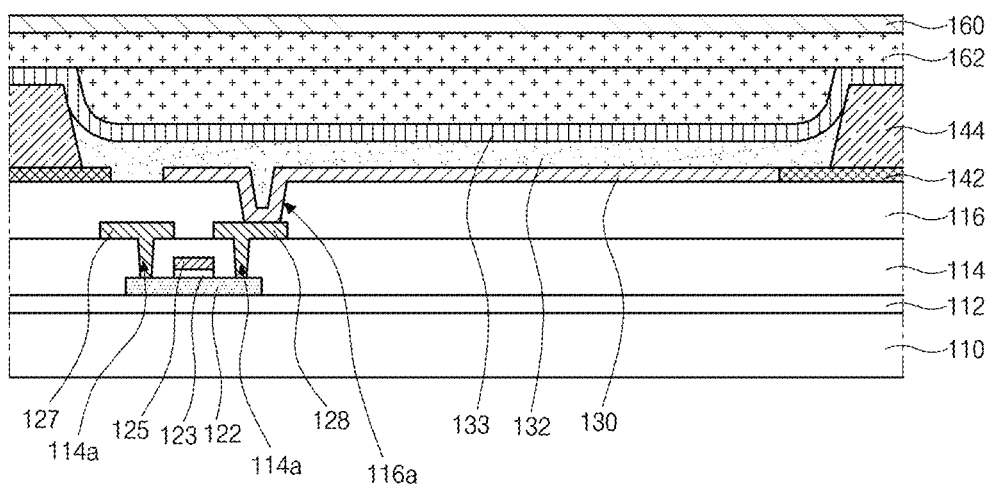
FIG. 2 is a view showing the structure of one pixel of the organic light emitting display device according to one embodiment of the disclosure.

FIG. 2 is a view showing a structure of one pixel of the organic light emitting display device according to the disclosure.

As shown in FIG. 2, a buffer layer 112 is formed on a first substrate 110 and the driving thin film transistor is disposed on the buffer layer 112. The first substrate 110 may be made of a transparent material such as glass. Further, the first substrate 110 may be made of the transparent and flexible plastic such as polyimide. In addition, the buffer layer 112 may be formed of a single layer made of an inorganic material such as SiOx and SiNx, or formed of a plurality of layers made of an inorganic material such as SiOx and SiNx.

The driving thin film transistor is disposed in each pixel. The driving thin film transistor includes a semiconductor layer 122 on the buffer layer 112, a gate insulating layer 123 formed on at least a part of the semiconductor 122, a gate electrode 125 on the gate insulating layer 123, an interlayer 114 on the whole area of the first substrate 110 to cover the gate electrode 125, and a source electrode 127 and a drain electrode 128 on the interlayer 114 where the source electrode 127 is connected to the semiconductor layer 122 through a first contact hole 114a.

Not shown in figure, further, the switching thin film transistor is disposed on the first substrate 110. The switching thin film transistor may have the same structure as the driving thin film transistor.

The semiconductor layer 122 may formed of crystalline silicon or oxide semiconductor such as indium gallium zinc oxide (IGZO). The semiconductor layer 122 includes a channel layer in the center region and a doping layer in both sides of the channel layer. The source electrode 127 and the drain electrode 128 are contacted with the doping layer.

The gate electrode 125 can be formed of a metal such as chromium Cr, molybdenum Mo, tantalum Ta, copper Cu, titanium Ti, aluminum Al or Al alloy. The gate insulating layer 123 and the interlayer 114 may be formed of a single layer made of an inorganic insulating material such as SiOx or SiNx. Further, the gate insulating layer 123 and the interlayer 114 may be formed of double layers including SiOx layer and SiNx layer. The source electrode 127 and the drain electrode 128 may be formed of Cr, Mo, Ta, Cu, Ti, Al, or Al alloy.

Although the driving thin film transistor has a specific structure in the drawings and the above description, the driving thin film transistor of the invention is not limited to the illustrated structure, and any driving thin film transistor of any structure may be applied.

On the driving thin film transistor, a passivation layer 116 is formed. The passivation layer 116 may be formed of the organic material such as a photo-acryl. Further, the passivation layer 116 may be formed of a plurality of layers including inorganic layer and organic layer. A second contact hole 116a is formed in the passivation layer 116.

On the passivation layer 116, a first electrode 130 is formed and connected electrically to the drain electrode 128 of the driving thin film transistor through the second contact hole 116a. The first electrode 130 may be formed of single layer or a plurality of layers made of the metal such as calcium Ca, Barium Ba, magnesium Mg, aluminum Al, silver Ag, or an alloy thereof. The first electrode 130 is connected to the drain electrode 128 of the driving thin film transistor to apply an image signal from the outside.

The first bank layer 142 and the second bank layer 144 are formed at the boundary between the pixels P on the passivation layer 116. The first bank layer 142 and the second bank layer 144 which serves as a barrier layer partitions each pixels P to prevent the mixture of the light of different colors from the neighboring pixels. As shown in figure, the first bank layer 142 is formed on the passivation layer 116 and the second bank layer 144 is formed on the first bank layer 142. However, the first bank layer 142 may be on the first electrode 130 and the first electrode 130 may be extended to the side surfaces of the first bank layer 142 and the second bank layer 144.

The organic light emitting layer 132 is formed on the first electrode 130 and the bank layers 142 and 144. Although described in detail later, the organic light emitting layer 132 may be formed by coating and drying the organic light emitting material in a solution state on the first electrode 130, rather than the thermal evaporation process. The organic light emitting layer 132 may be an R-organic light emitting layer formed on R pixel, G-organic light emitting layer, or a B-organic light emitting layer to emit respectively red light, green light, or blue light.

Although the organic light emitting layer 132 is formed in only one pixel P in the figure, the organic light emitting layer substantially formed over a plurality of pixels of same color arranged in the strip form. Thus, the organic light emitting layer 132 is not formed to have a predetermined thickness in the plurality of pixels P and then a variation occurs in thicknesses of the outer region and the center region of the display device. The thickness variation of the organic light emitting layer 132 is caused by coating and drying of the organic light emitting layer 132.

When the coated organic light emitting materials in the solution is dried, the solvent in the organic light emitting material is removed by evaporation and only the organic light emitting material remains. Since the evaporation rate of the solvent in the outer region of the display device is greater than that in the central region of the display device, the organic light emitting material in the outer region of the display device is dried first. Accordingly, a portion of the organic light emitting material 132 of the un-dried central region is spread to the outer region, so that the thickness deviation between the outer region and the central region of the display device occurs.

The organic light emitting layer 132 may include light emitting layer, an electron injecting layer and a hole injecting layer for injecting respectively electrons and holes into the light emitting layer, and an electron transporting layer and a hole transporting layer for transporting respectively the injected electrons and holes to the light emitting layer.

A second electrode 133 is formed on the organic light emitting layer 132. The second electrode 133 may be made of transparent conductive material such as Indium Tin Oxide (ITO) and Indium Zinc Oxide (IZO) or the thin metal for passing visual light therethrough. However, the second electrode 133 is not limited these materials.

An adhesive layer 162 is deposited on the second electrode 133, and a second substrate 160 is disposed on the adhesive layer 162 so that the second substrate 160 is attached to the display device. Any material may be used as the adhesive layer as long as it has good adhesion and heat resistance and water resistance. A thermosetting resin such as an epoxy compound, an acrylate compound, or an acrylic rubber may be used as the adhesive layer 162. Further, a photocurable resin may be used as the adhesive layer 162. In this case, the adhesive layer 162 is cured by irradiating the adhesive layer 162 with light such as ultraviolet rays.

The adhesive layer 162 may not only bond the first substrate 110 and the second substrate 160, but also encapsulate display device to block the moisture thereto. Although the reference number 162 is called as the adhesive for convenience, thus, the reference number 162 can be called as encapsulant.

The second substrate 160 is an encapsulation cap for encapsulating the organic light emitting display device. The second substrate 160 may be made of protection film such as a polystyrene film, polyethylene film, polyethylene naphthalate film, or polyimide film. Further, the second substrate 160 may made of a glass.

Not shown in figure, a planarization layer may be disposed between the second electrode 133 and the adhesive layer 162. The planarization layer may be formed a single organic layer or a plurality of layers of inorganic layer and organic layer. For example, the inorganic layer may be made of SiOx and SiNx and the organic layer may be made of photo-acryl. However, the planarization layer is not limited these materials.

The first electrode 130, the organic light emitting layer 132, and the second electrode 133 form an organic light emitting diode. The first electrode 130 is a cathode of the organic light emitting diode and the second electrode 133 is an anode of the organic light emitting diode. When voltage is applied to the first electrode 130 and the second electrode 133, the electrons are injected into the organic light emitting layer 132 from the first electrode 130, and the holes are injected into the organic light emitting layer 132 from the second electrode 133. By the electrons and the holes, excitons are generated in the organic light emitting layer 132. As these excitons decay, light corresponding to the energy difference between Low Unoccupied Molecular Orbital (LUMO) and Highest Occupied Molecular Orbital (HOMO) of the light emitting layer is generated and emitted to the outside of the second substrate 160.

Further, the first electrode 130 is made of a transparent conductive material such as indium tin oxide ITO or indium zinc oxide IZO or a metal having a thin thickness through which visible light is transmitted, and the second electrode 133 is formed in single layer or a plurality of layers made of metal such as Ca, Ba, Mg, Al, Ag, or the like. The light generated in the organic light emitting layer 132 may be emitted to the outside of the first substrate 110.

In the organic light emitting display device of the present invention, not only the organic light emitting diode having the above structure but also various organic light emitting diode currently known may be applied.

In this organic light emitting display device, each of the pixel P is divided by the bank layer and the organic light emitting diode having R, G, B-organic light emitting layers are in each pixel.

In this disclosure, the bank layer is formed in the double layers of the first bank layer 142 and the second bank layer 144 thereon. In this disclosure, in particular, the first bank layer 142 is made of hydrophilic material and the second bank layer 144 is made of hydrophobic material. At that time, the width of the first bank layer 142 is larger than that of second bank layer 144, so that the first bank layer 142 is exposed through both sides of the second bank layer 144 and the organic light emitting layer 132 is disposed on the first electrode 130 and the exposed area of the first bank layer 142.

Further, the width of the first bank layer 142 is identical with the width of the second bank layer 144 to align the first bank layer 142 and the second bank layer. The organic light emitting layer 132 is formed on only the first electrode 130.

As described above, the bank layers include the hydrophilic first bank layer 142 and the hydrophobic second bank layer 144 to form rapidly the organic light emitting layer 132 and fabricate the organic light emitting display device of large area. Hereinafter, this reason will be described in more detail.

Figure 3:
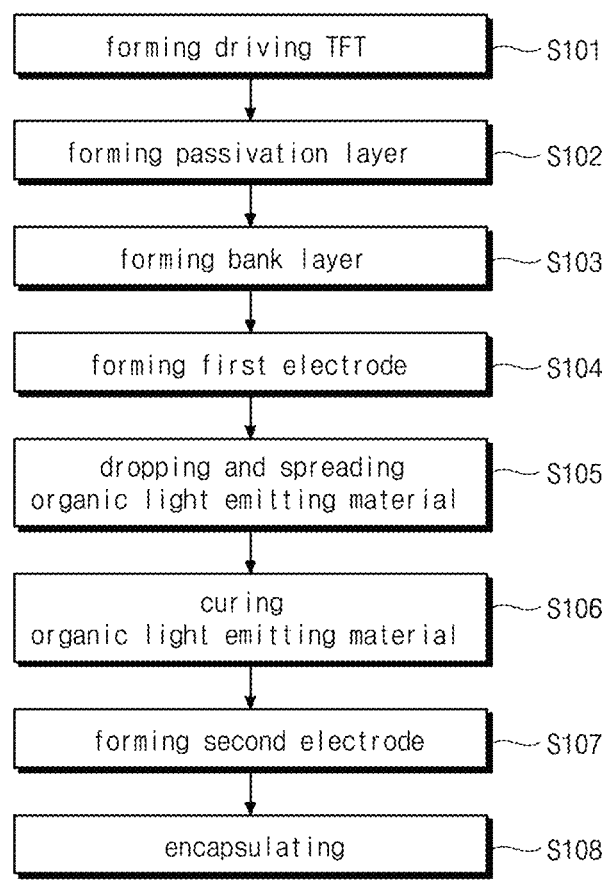
FIG. 3 is a flow chart showing the fabrication process of the organic light emitting display device according to one embodiment of the disclosure.

FIG. 3 is a flow chart showing the fabrication process of the organic light emitting display device according to one embodiment of the disclosure and a method of fabricating the organic light emitting display device according to the disclosure will be described accompanying this drawing.

As shown in FIG. 3, the buffer layer 112 is first formed on the first substrate and then the driving thin film transistor including the semiconductor layer 122, the gate insulating layer 123, the gate electrode 125, the interlayer 114, the source electrode 127, and the drain electrode 128 is formed on the buffer layer 112 (S101).

Thereafter, the organic material such as photo-acryl is deposited over the whole area of the first substrate 110 having the driving thin film transistor to form the passivation layer 116 (S102) and then the first and second bank layers 142 and 144 formed on the passivation layer (S103).

In this case, the first bank layer 142 is disposed along the circumference of the all the pixels P of the organic light emitting display device to divide all the pixels from the other pixels. The second bank layer 144 partitions the pixels P of same color from the pixels P of different colors.

Figure 4:
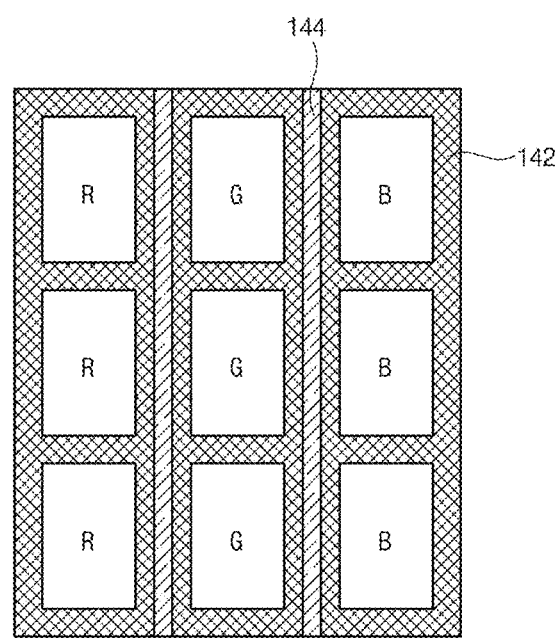
FIG. 4 is a plan view showing schematically a first bank layer and a second bank layer according to one embodiment of the disclosure.

FIG. 4 is a plan view showing schematically the first bank layer 142 and the second bank layer 144 according to the disclosure.

As shown in FIG. 4, a plurality of R, G, B pixels are respectively disposed in the organic light emitting display device in FIG. 2 and the R, G, B organic light emitting layers are respectively disposed in each R, G, B pixels. Each of the R, G, B pixels are respectively arranged in strip form and then the R, G, B pixels are repeatedly disposed in the transverse direction or the longitudinal direction.

The first bank layer 142 is formed outside of each of the plurality of R, G, and B pixels, such that R, G, and B pixels are partitioned from other pixels. That is, the first bank layer 142 defines a pixel in which an organic light emitting diode of the organic light emitting display device is provided.

The second bank layer 144 is disposed between the R, G, B pixels which are arranged in the longitudinal direction. Since one pixel column includes a plurality of pixels of the same color which are arranged in the longitudinal direction in strip form, the pixel columns of different colors are divided by the second bank layer 144. The second bank layer 144 is formed on the first bank layer 142 with a width smaller than that of the first bank layer 142.

Referring back to FIG. 3, the first electrode 130 is formed in each pixel (S104) and then the organic light emitting material is deposited and cured to form the organic light emitting layer 132 (S105, S106). Since the first electrode 130 is formed in a unit of the first bank layer 142, that is, the pixel unit, the first electrode 130 is separated between the neighboring pixels. Since the organic light emitting layer 132 is formed in the unit of the second bank layer 144, that is, the unit of pixel column, the organic light emitting layer 132 continuously formed in a plurality of pixels P arranged in longitudinal direction.

Thereafter, the second electrode 133 is formed on the organic light emitting layer 132 and then encapsulated to complete the organic light emitting display device (S107, S108).

As described above, in the organic light emitting display device according to the invention, the organic light emitting material is coated in the area partitioned by the first bank layer 142 and the second bank layer 144 and dried (or cured) to form the organic light emitting layer 132, the coating method of the organic light emitting material will be described with FIG. 5.

Figure 5:
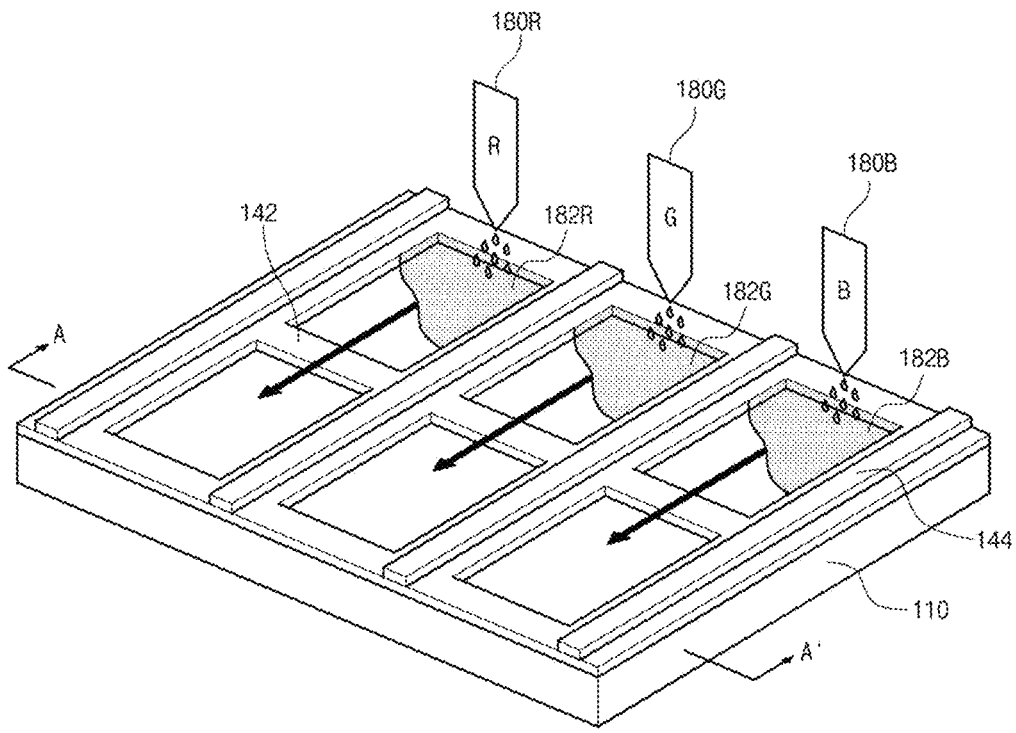
FIG. 5 is a view showing the coating process of the organic light emitting material of the organic light emitting display device according to one embodiment of the disclosure.

FIG. 5 is a view showing the coating process of the organic light emitting material of the organic light emitting display device according to the one embodiment of the disclosure. In FIG. 5, only the first bank layer 142 and the second bank layer 144 are shown on the first substrate 110 for convenience of description, and other components such as a thin film transistor are omitted.

As shown in FIG. 5, a plurality of R, G, B pixels are formed on the first substrate 110. A plurality of pixels of same color are arranged in the strip form in the first direction (for example, the longitudinal direction) and the plurality of pixels of different colors are alternatively arranged in the second direction (for example, RGBRGB in the traverse direction). Taking for an example, the first direction and the second direction are orthogonal. When the first direction is the longitudinal direction, the second direction is the traverse direction, and when the first direction is the traverse direction, the second direction is the longitudinal direction. In this specification, the description is made by assuming that the first direction is the longitudinal direction and the second direction is the traverse direction.

The first bank layer 142 is formed along the first and second directions of the first substrate 110 so that the first bank layer 142 is disposed along the circumference of the all the R, G, B pixels. The second bank layer 144 is formed along the first direction on the first bank layer 142 and thus the second bank layer 144 is disposed between the pixels of different colors, for example, between the R pixel column and the G pixel column, between the G pixel column and B pixel column, and between the R pixel column and the R pixel column.

After the first and second bank layers 142 and 144 are formed, a dispensing device having a first dispenser 180R, a second dispenser 180G, and a third dispenser 180B containing respectively R-organic light emitting material 182R, G-organic light emitting material 182G, and B-organic light emitting material 182B is over at least one position of each of R-pixel column, G-pixel column, and B-pixel column defined by the second bank layer 144. Then, the organic light emitting material 182R, 182G, and 182B of predetermined amount is dropped at each of pixel columns.

Not shown in figure, each of the first to third dispensers 180R, 180G, and 180B includes a nozzle for opening and closing at the predetermined period to dispense the organic light emitting material 182R, 182G, and 182B of desired amount on the first substrate 110. At this time, the nozzle of the dispensers 180R, 180G, and 180B may be opened for a relatively short time and small amounts of the organic light emitting materials 182R, 182G, and 182B are dropped several times. Further, desired amount of the organic light emitting materials 182R, 182G, and 182B may be dropped once.

As shown in figure, the first to third dispenser 180R, 180G, and 180B are respectively disposed in each pixel column so that the organic light emitting materials 182R, 182G, and 182B are dropped in only one position of the corresponding pixel. Further, a plurality of first to third dispensers 180R, 180G, and 180B may be disposed in each pixel column and then the organic light emitting materials 182R, 182G, and 182B may be dropped in a plurality of positions of each corresponding pixel columns. In addition, the first to third dispenser 180R, 180G, and 180B may move to drop the organic light emitting materials 182R, 182G, and 182B at a plurality of positions of each pixel column.

As described above, by dropping the organic light emitting material at a plurality of positions of one pixel column, the organic light emitting layer can be quickly formed even in a large area organic light emitting display device.

Meanwhile, in the disclosure, various devices such as a slit coater having slit for discharging the organic light emitting material 182R, 182G, and 182B and a drop coater for dropping the organic light emitting material 182R, 182G, and 182B of predetermined amount may be used as the dispensing device.

The organic light emitting material 182R, 182G, and 182B dropped in the pixel column spreads along the pixel column arrange in the first direction. In this case, the first bank layer 142 and the second bank layer 144 are disposed between the pixels of different colors in the first direction. Further, only the first bank layer 142 is disposed between a plurality of pixels of pixel column arranged along the first direction. Thus, the dropped organic light emitting materials 182R, 182G, and 182B are not spread in the second direction by the first bank layer 142 and the second bank layer 144 thereon, and flow only in the first direction over the first bank layer 142, so that the organic light emitting materials 182R, 182G, and 182B are uniformly coated over the entire area of each of the corresponding R, G, B pixel columns.

The organic light emitting layer may be formed by applying the heat to organic light emitting materials 182R, 182G, and 182B to remove the solvent therefrom.

As described above, in the disclosure, the organic light emitting layer is formed by coating process rather than thermal deposition process. In particular, in the disclosure, the first bank layer 142 is formed along the second direction, and the double bank layers of the first bank layer 142 and the second bank layer 144 are formed along the first direction (pixel column direction) between pixels of different colors. Therefore, the organic light emitting materials 182R, 182G, and 182B are coated to the plurality of pixels disposed in each of the R, G, and B pixel columns at the same time, so that the organic light emitting materials 182R, 182G, and 182B may be rapidly coated.

When the bank layer is made of a single layer, all the pixels are made of bank layers of the same height and all the pixels are separated from adjacent pixels by a single bank layer. Therefore, in order to form the organic light emitting layer 132 by the dropping method, the organic light emitting materials 182R, 182G, and 182B should be dropped independently of each pixel. In other words, dropping must be performed a number of times corresponding to the number of pixels. On the other hand, in the disclosure, since the organic light emitting materials 182R, 182G, and 182B are respectively coated to a plurality of pixels arranged in corresponding pixel columns arranged along the first direction by one drop, the organic light emitting layer 132 may be rapidly formed comparing to the structure having the single bank layer.

In the disclosure, the inclined angles of the both sides of the second bank layer 144 adjacent respectively to the pixels of different colors are set differently, so that the organic light emitting layer 132R, 132G, and 132B are formed to have a uniform thickness in the R, G, B pixels. Hereinafter, this will be described in more detail with reference to the accompanying drawings.

Figure 6:
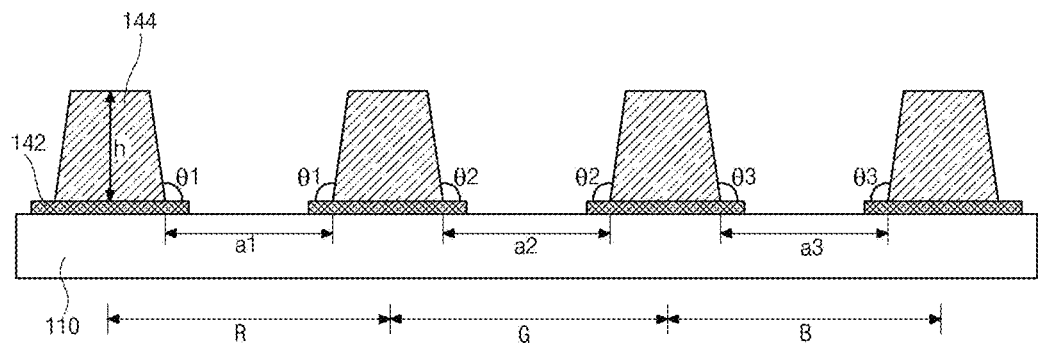
FIG. 6 is a view showing schematically the organic light emitting display device according to a first embodiment of the disclosure.

FIG. 6 is a sectional view along line A-A' of FIG. 5 showing schematically the organic light emitting display device according to the first embodiment of the disclosure.

The structure of the organic light emitting display device according to this embodiment is similar with that of FIG. 2 except for the second bank layer 144 and thus only the first bank layer 142 and the second bank layer 144 on the first substrate 110 are shown in the figure.

As shown in FIG. 6, a plurality of R, G, B pixels of different colors are disposed on the first substrate 110 and the first bank layer 142 and the second bank layer 144 are disposed between the pixels of different colors. In this case, the width of the first bank layer 142 is larger than that of the second bank layer 144 so that a part area of the first bank layer 142 is exposed when the second bank layer 144 is disposed on the first bank layer 142. When the organic light emitting material is coated in the R, G, B pixels, thus, the organic light emitting material is coated over the first substrate 110 (that is, on the first electrode) and the exposed area of the first bank layer 142. Accordingly, the luminescent areas a1, a2, and a3 caused by the organic light emitting layer are dependent upon the second bank layer 144.

The side surface of the second bank layer 144 adjacent to the pixel is inclined at a predetermined angle from the surface of the first substrate 110 of the pixel or the surface of the first electrode of the pixel. The inclined angle θ1 of the side surface adjacent to the R-pixel, the inclined angle θ2 of the side surface adjacent to the G-pixel, and the inclined angle θ3 of the side surface adjacent to the B-pixel are different from each other (θ1≠θ2≠θ3). In particular, the relationship between the inclined angles of side surfaces of the second bank layer 144 is θ1<θ2<θ3.

As described above, the inclined angles of the side surfaces of the second bank layer 144 adjacent to the pixels of different colors are different for the following reasons.

Figure 7A:
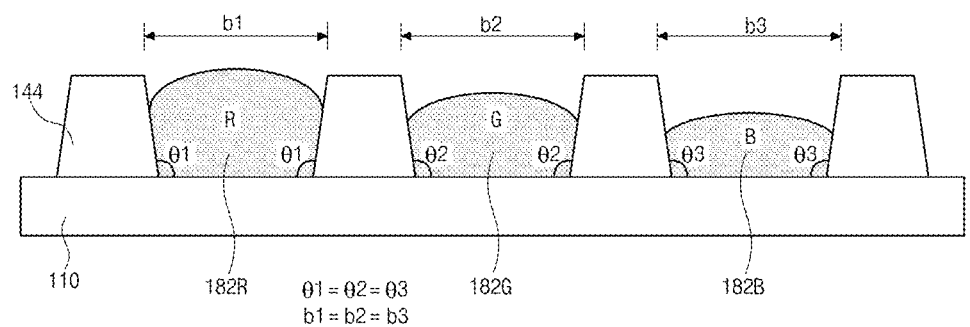
FIGS. 7A and 7B are views respectively showing a coating structure of the organic light emitting material and profile of dried organic light emitting layer when inclined angles of the side surface of the second bank layer are identical in R, G, and B pixels.

FIG. 7A is a view showing coating of the organic light emitting material 182R, 182G, and 182B when the inclined angles of the side surfaces of the second bank layer 144 are identical in the R, G, B pixels.

As shown in FIG. 7A, the thickness of the R-organic light emitting material 182R is the largest and the thickness of the B-organic light emitting material 182B is the smallest when the R, G, B organic light emitting materials 182R, 182G, and 182B are coated. Since the wavelengths of light emitted from the R-organic light emitting layer, the G-organic light emitting layer, and the B-organic light emitting layer are different, the thickness of the organic light emitting layer should be correspondent with wavelength of the light in order to emit the light of the corresponding color. Further, in order to form organic light emitting layers of different thicknesses, corresponding organic light emitting materials must also be coated at different thicknesses.

The organic light emitting layer is formed by coating the R-organic light emitting material, the G-organic light emitting material, and the B-organic light emitting material in the different thickness and drying these materials to remove the solvent therefrom. Since the R-organic light emitting material 182R, the G-organic light emitting material 182G, and the B-organic light emitting material 182B are dried under the same dry conditions such as the same temperature, the R-organic light emitting material 182R, the G-organic light emitting material 182G, and the B-organic light emitting material 182B are dried at the same dry speed.

Since the R-organic light emitting material 182R, the G-organic light emitting material 182G, and the B-organic light emitting material 182B of different thicknesses are dried at the same dry speed, therefore, the B-organic light emitting material 182B is completely dried first, the G-organic light emitting material 182G is completely dried second, and the R-organic light emitting material 182R is completely dried last. As described above, a thickness variation occurs in the dried organic light emitting layer due to a difference in drying time of the R-organic light emitting material 182R, the G-organic light emitting material 182G, and the B-organic light emitting material 182B.

Each of the R-organic light emitting material 182R, the G-organic light emitting material 182G, and the B-organic light emitting material 182B is melted in a solvent, and then dropped and spread to the corresponding pixel column on the substrate 110 in a solution state. When the R-organic light emitting material 182R, the G-organic light emitting material 182G, and the B-organic light emitting material 182B are dried, the solvent is removed by evaporation and only the R-organic light emitting material 182R, the G-organic light emitting material 182G, and the B-organic light emitting material 182B are remain. Thus, the organic light emitting layer is composed of only the R-organic light emitting material 182R, the G-organic light emitting material 182G, and the B-organic light emitting material 182B.

The coating thickness of the R-organic light emitting material 182R is the largest and the coating thickness of the B-organic light emitting material 182B is the smallest. Further, all of the R-organic light emitting material 182R, the G-organic light emitting material 182G, and the B-organic light emitting material 182B are dried under the same dry conditions. Thus, the B-organic light emitting material 182B is completely dried first, the G-organic light emitting material 182G is completely dried second, and the R-organic light emitting material 182R is completely dried last. When the R-organic light emitting material 182R, the G-organic light emitting material 182G, and the B-organic light emitting material 182B are dried at a time difference, each of the R-organic light emitting material 182R, the G-organic light emitting material 182G, and the B-organic light emitting material 182B affect the drying condition of other organic light emitting material.

For example, if the solvent remains in the R-organic light emitting material 182R and the G-organic light emitting material 182G after the B-organic light emitting material 182B is completely dried, the drying process should be continued to remove the solvent from the R-organic light emitting material 182R and the G-organic light emitting material 182G. Accordingly, the dry condition of the G-organic light emitting material 182G is different at the both sides thereof adjacent to the fully dried B-organic light emitting material 182B and the R-organic light emitting material 182R in which the drying process is continued.

There is no solvent to be evaporating (or volatilizing) in the upper atmosphere of the fully dried B-organic light emitting material 182B, while there is a solvent to be evaporating (or volatilizing) in the upper atmosphere of the dry R-organic light emitting material 182R in which the drying process is continued. Thus, the drying speed of the G-organic light emitting material 182G in the region adjacent to the B pixel is faster than the drying speed of the G-organic light emitting material 182G in the region adjacent to the R pixel.

The drying speed of both sides of the G-organic light emitting material 182G is different, and the thickness of the completely dried organic light emitting layer is uneven due to the difference in the drying speed. This phenomenon is not limited to the G-organic light emitting material 182G. Since the pixels repeat the arrangement of RGBRGB . . . along the second direction, the dry state of the G-organic light emitting material 182G and the R-organic light emitting material 182R affect the drying speed of the B-organic light emitting material 182B. Further, the dry state of the B-organic light emitting material 182B and the G-organic light emitting material 182G affects the drying speed of the R-organic light emitting material 182R.

In other word, drying times of the R-organic light emitting material 182R, the G-organic light emitting material 182G, and the B-organic light emitting material 182B are different from each other because of difference of the coating thickness thereof, and then the drying speed is different depending on the position of each of the R-organic light emitting material 182R, the G-organic light emitting material 182G, and the B-organic light emitting material 182B due to the difference of the drying time. As a result, the thickness of the completely dried R, G, B organic light emitting layer is uneven.

Figure 7B:
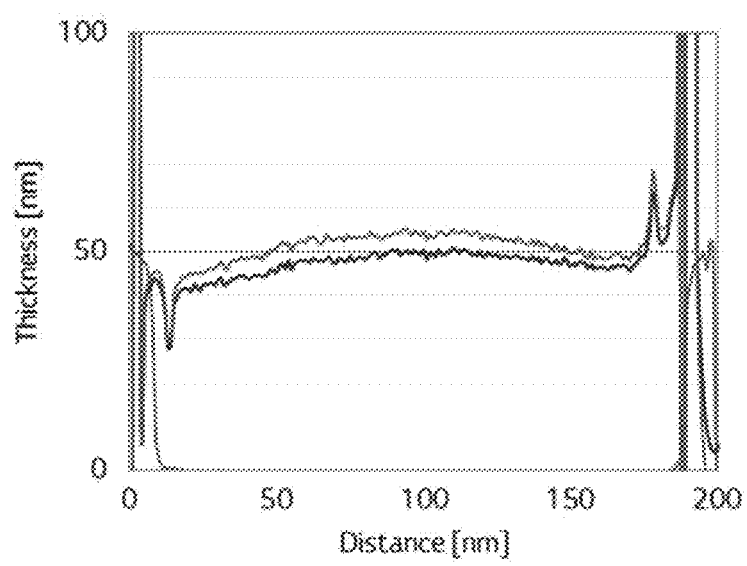

FIG. 7B is a profile of the completely dried organic light emitting layer in case where the inclined angles of the side surfaces of the completely dried organic light emitting layers are all the same ($\theta1=\theta2=\theta3$).

As shown in FIG. 7B, in case where the inclination angles of the side surfaces of the second bank layer 144 are the same ($\theta1=\theta2=\theta3$), the thickness of the organic light emitting layer on the left side of the pixel is less than 50 nm, the thickness of the organic light emitting layer in the center of the pixel is about 50 nm, and the thickness of the organic light emitting layer on the right side of a pixel is larger than 50 mn, in case where the organic light emitting layer is formed to a thickness of about 50 nm. In other words, when the inclined angles of the side surfaces of the second bank layer 144 are all the same ($\theta1=\theta2=\theta3$), the thickness of the organic light emitting layer is not the same in the pixel, and there is a thickness deviation depending on the position.

Due to the thickness variation of the organic light emitting layer in the pixel, the color light having a wavelength variation is emitted instead of emitting color light having a uniform wavelength, when the light of a specific color is emitted from the organic light emitting layer, thereby causing a decrease in the quality of color light.

On the other hand, in the disclosure, the thickness of the organic light emitting layer can be made uniform by forming different inclined angles of the side surfaces of the second bank layer 144 adjacent to the pixels of different colors.

Figure 8:
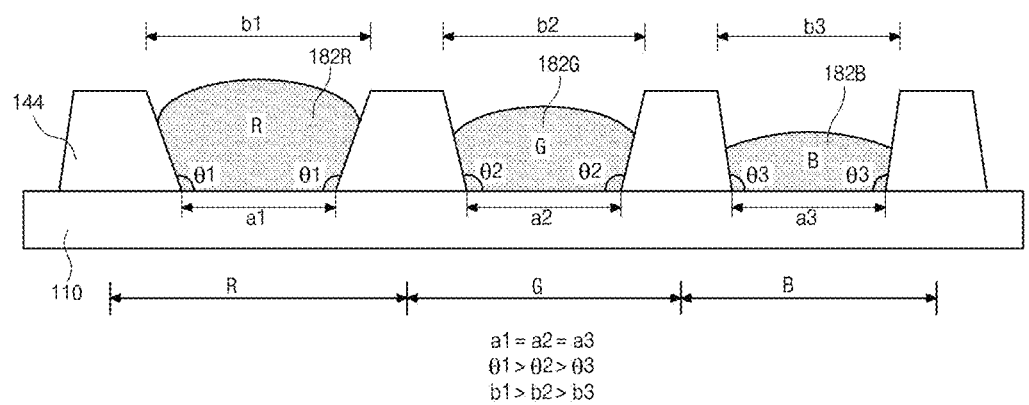
FIG. 8 is a view showing coating of the organic light emitting material according to the first embodiment of the disclosure.

FIG. 8 is a view showing coating of the organic light emitting material 182R, 182G, and 182B according to the disclosure. Where the first bank layer 142 is substantially formed under the second bank layer 144, but the first bank layer 142 is omitted to mainly describe the inclined angle of the side surface of the second bank layer 144.

In the organic light emitting display device, as shown in FIG. 8, the R, G, and B-organic light emitting materials 182R, 182G, and 182B are coated on the R, G, and B pixels, respectively. At this time, the coating thickness of the R-organic light emitting material 182R is the largest and the coating thickness of the B-organic light emitting material 182B is the smallest. The R, G, and B-organic light emitting materials 182R, 182G, and 182B are respectively coated to a region partitioned by the second bank layer 144. The emission area (i.e., the width of the region exposed through the second bank layer 144) is the same (a1=a2=a3).

Both side surfaces of the second bank layer 144 are inclined in the predetermined angle. Both side surfaces of the second bank layer 144 are respectively contacted with the organic light emitting materials of different colors and the inclined angles of the both side surfaces of the second bank layer 144 are different. In FIG. 8, the relationship between the inclined angle θ1 of the side surfaces of the second bank layer 144 coated with (contacted with) the R-organic light emitting material 182R, the inclined angle θ2 of that the side surfaces coated with the G-organic light emitting material 182G, and the inclined angle θ3 of the side surfaces coated with the B-organic light emitting material 182B is θ1>θ2>θ3.

The inclined angle of the side surface of the second bank layer 144 determines the exposure area of the R, G, and B pixels exposed upward through the second bank layer 144 and this exposed area refers to the solvent evaporating area (i.e., the dry surface area) where the solvent evaporates upon drying of the organic light emitting materials 182R, 182G, and 182B. As the inclined angle of the side surface of the second bank layer 144 increases, the dry surface area of the pixels R, G, and B increases.

In the disclosure, since the relationship between the inclined angle θ1 of the side surfaces of the second bank layer 144 coated with the R-organic light emitting material 182R, the inclined angle θ2 of the side surface coated with the G-organic light emitting material 182G, and the inclined angle θ3 of the side surface coated with the B-organic light emitting material 182B is θ1>θ2>θ3, the dry surface areas b1, b2, and b3 of the R, G, and B pixels are b1>b2>b3.

As the dry surface area increases, the evaporating amount of the solvent increase under the same conditions and same period. Thus, as the dry surface area increases, the drying rate increases. Since the dry surface area b1 of the R pixel is the largest and the dry surface area b3 of the G pixel is the smallest, the drying speed of the R pixel is the fastest and the drying speed of the G pixel is the slowest within the same conditions and same period.

As described above, in the disclosure, the inclined angle θ1 of the side surfaces of the second bank layer 144 defining the R pixel, in which the coating thickness of the organic light emitting material, i.e., 182R, is the largest so that the dry surface area b1 is the largest and then the dry speed is the fastest. Thus, the R-organic light emitting material 182R is dried faster than the G-organic light emitting material 182G and the B-organic light emitting material 182B.

In the disclosure, furthermore, the inclined angle θ3 of the side surfaces of the second bank layer 144 defining the B pixel, in which the coating thickness of the organic light emitting material, i.e., 182B, is the smallest so that the dry surface area b1 is the smallest and then the dry speed is the slowest. Thus, the B-organic light emitting material 182B is dried slower than the R-organic light emitting material 182R and the G-organic light emitting material 182G.

In other word, the R-organic light emitting material 182R having the thickest thickness has the fastest drying speed, the B-organic light emitting material 182B having thinnest thickness has the slowest drying speed, and the G-organic light emitting material 182G having intermediate thickness is dried at an intermediate drying speed, so that all of the organic light emitting materials 182R, 182G, and 182B may be dried in the same time.

The inclined angles θ1, θ2, and θ3 of side surfaces of the second bank layer 144 are dependent upon the drying condition of the organic light emitting materials 182R, 182G, and 182B such as coating thickness, drying temperature, and drying time. For example, The inclined angles θ1, θ2, and θ3 of side surfaces of the second bank layer 144 are increased as the coating thickness of the organic light emitting materials 182R, 182G, and 182B are increased.

Figure 9:
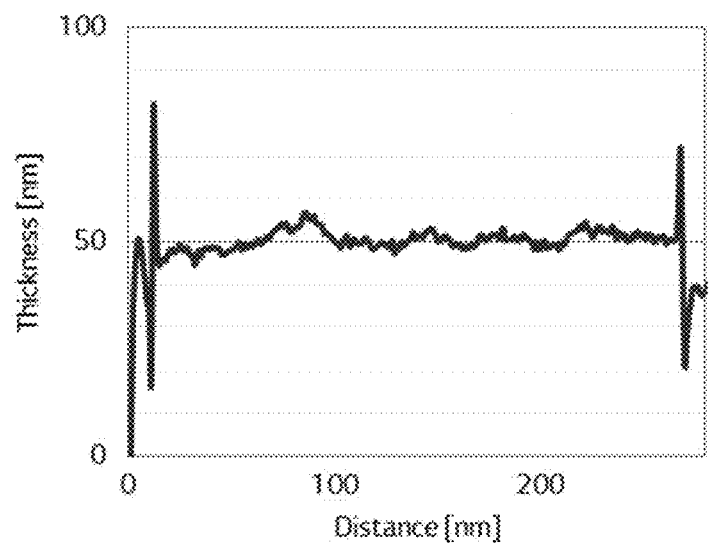
FIG. 9 is a view showing a profile of the organic light emitting layer according to the first embodiment of the disclosure.

FIG. 9 is a view showing profile of the organic light emitting layer according to the first embodiment of the disclosure. As shown in FIG. 9, it can be seen that the organic light emitting layer formed in one pixel is uniformly formed to about 50 nm in thickness regardless of the position. In case where the profile of the organic light emitting layer according to the disclosure is compared with the profile of the organic light emitting layer in which the inclination angles of the side surfaces of the second bank layer 144 are all the same (θ1=θ2=θ3) as shown in FIG. 7B, the organic light emitting layer of the disclosure may be formed in much more uniform thickness, compared to the organic light emitting layer in which the inclined angles of the side surfaces of the second bank layer 144 are all the same.

As described above, the reason why the organic light emitting layer can be formed to have a uniform thickness is that all of the organic light emitting materials 182R, 182G, and 182B are dried in a same period by controlling the drying surface area, i.e., the inclined angles of the side surfaces of the second bank layer 144, according to the thickness of the organic light emitting materials 182R, 182G, and 182B.

That is, since the organic light emitting materials 182R, 182G, and 182B of all the pixels R, G, and B is completely dried in same time, the organic light emitting material in one pixel is not affected by the organic light emitting material in the adjacent pixel so that the organic light emitting layer is formed in the uniform thickness in the whole area of the organic light emitting display device.

Figure 10:
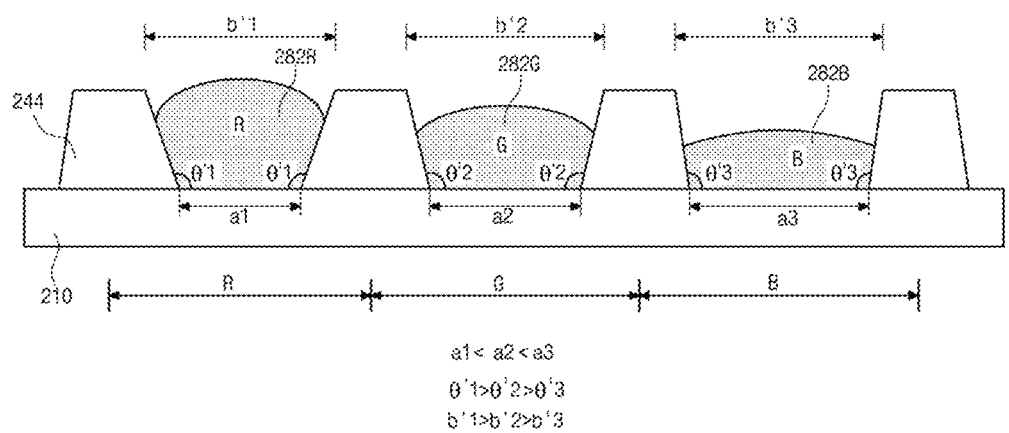
FIG. 10 is a view showing schematically the organic light emitting display device according to a second embodiment of the disclosure.

FIG. 10 is a view showing structure of the second bank layer 244 of the organic light emitting display device according to a second embodiment of the disclosure.

As shown in FIG. 10, a plurality of second bank layers 244 are formed on the first substrate 210 to define a plurality of R, G, B pixels, and the R-organic light emitting material 282R, the G-organic light emitting material 282G, and the B-organic light emitting material 282B are respectively coated in the R, G, B pixels. The R-organic light emitting material 282R, the G-organic light emitting material 282G, and the B-organic light emitting material 282B are respectively dropped in corresponding pixel columns, and then spread along a plurality of pixels of the pixel columns.

Not shown in figure, the first bank layer having a wider width than that of the second bank layer 244 is disposed under the second bank layer 244. The first bank layer is disposed along the first direction (vertical direction) and the second direction (horizontal direction), and the second bank layer 244 is disposed on the first bank layer along the first direction.

The pixel defined by the second bank layer 244 is the luminescent area. In this embodiment, the luminescent areas a1, a2, and a3 of the R, G, B pixels is different for each other (a1≠a2≠a3). At this time, the relationship between the luminescent area a1 of the R pixel, the luminescent area a2 of the G pixel, and the luminescent area a3 of the B pixel is a1<a2<a3. In this embodiment, as described above, the luminescent area a1 of the R pixel, the luminescent area a2 of the G pixel, and the luminescent area a3 are set in different size in consideration of luminance and light efficiency for each color.

In order to emit the light similar to natural light, the luminance and light efficiency of light emitted from the R, G, and B pixels should be uniform. However, since the organic light emitting diodes have different luminance and the light efficiency for each color, the image quality of the organic light emitting display device is degraded when the luminescent areas of the pixels are formed in the same size.

The luminance and the light efficiency are lowered in order of the R-organic light emitting diode, the G-organic light emitting diode, and the B-organic light emitting diode. In the disclosure, it is possible to cancel the low luminance and the light efficiency by increasing the luminescent area of the pixel of the color with low luminance and light efficiency relatively, thereby the deterioration caused by the low luminance and light efficiency may be prevented.

The increase in the luminescent area means the increase in the area where the organic light emitting material is exposed to the outside. Thus, the organic light emitting material 282B of the B pixel is dried faster than the organic light emitting materials 282R and 282G of the R and G pixels by minimizing the light luminescent area a1 of the R pixel and maximizing the light luminescent area a3 of the B pixel. Moreover, the organic light emitting material 282B of the B pixel is coated the thinnest. Accordingly, since the drying time of the organic light emitting material 282B of the B pixel is much shorter than that of the organic light emitting materials 282R and 282G of the R and G pixels, the profile of the dried organic light emitting layer in the pixel of this embodiment is more uneven than the profile of the organic light emitting layer according to the first embodiment.

In order to solve the uneven problem of the profile, the dry surface areas b'1, b'2, and b'3 of the R, G, and B pixels are b'1>b'2>b'3 and the inclined angle of the side surface of the second bank layer 244 is formed differently for each pixel (θ'1'>θ'2'>θ'3') in this embodiment. The inclined angle of the side surface of the second bank layer 244 is set based on only the thickness difference of the organic light emitting material coated in the R,G,B pixels in the first embodiment, in particular, while in this embodiment, the inclined angles θ'1, θ'2, and θ'3 of the side surface of the second bank layer 244 is set based on the thickness difference of the organic light emitting materials 282R, 282G, and 282B coated in the R,G,B pixels and the difference of luminescent area a1, a2, and a3, wherein the inclined angle of the side surface of the second bank layer 244 is inversely proportional to the size of the luminescent area of the pixel. For this reason, the inclined angles θ'1, θ'2, and θ'3 of the side surfaces of the second bank layer 244 of this embodiment are set larger than the inclined angles θ1, θ2, θ3 of the side surfaces of the second bank layer of the first embodiment (θ'1>θ1, θ'2>θ2, θ'3>θ3).

In this case, the inclined angles θ'1, θ'2, and θ'3 of the side surfaces of the second bank layer 244 are dependent upon the coating thicknesses of the organic light emitting materials 282R, 282G, and 282B, the luminescent areas a1, a2, and a3, and the drying conditions.

Figure 11:
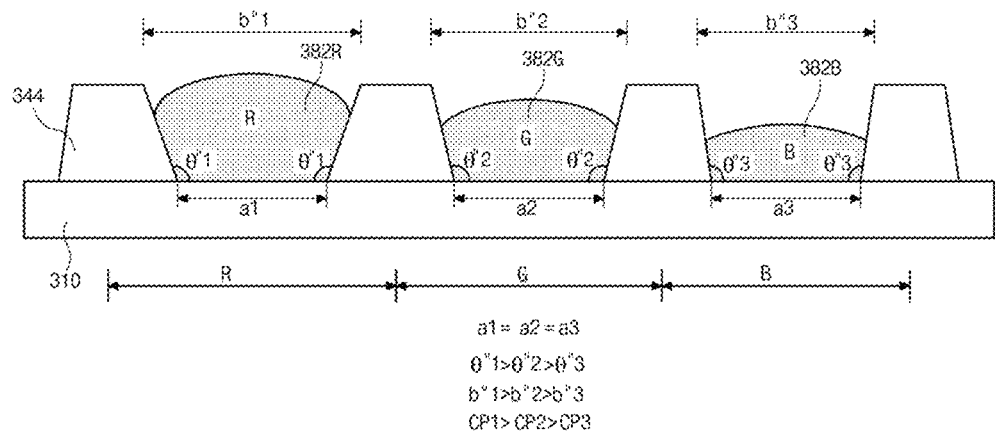
FIG. 11 is a view showing schematically the organic light emitting display device according to a third embodiment of the disclosure.

FIG. 11 is a view showing the structure of the second bank layer 344 of the organic light emitting display device according to a third embodiment of the disclosure.

As shown in FIG. 11, a plurality of second bank layers 344 are formed on the first substrate 310 to define a plurality of R, G, B pixels, and the R-organic light emitting material 382R, the G-organic light emitting material 382G, and the B-organic light emitting material 382B are respectively coated in the R, G, B pixels. At this time, the coating thickness of the R-organic light emitting material 382R is the largest, the coating thickness of the G-organic light emitting material 382G is intermediate, and the coating thickness of the B-organic light emitting material 382B is the smallest.

Not shown in figure, the first bank layer having a wider width than that of the second bank layer 344 is disposed under the second bank layer 344. The first bank layer is disposed along the first direction (vertical direction) and the second direction (horizontal direction), and the second bank layer 344 is disposed on the first bank layer along the first direction.

The pixel defined by the second bank layer 244 is the luminescent area. In this embodiment, the luminescent areas a1, a2, and a3 of the R, G, B pixels may be same or may be different for each other.

The R-organic light emitting material 382R, the G-organic light emitting material 382G, and the B-organic light emitting material 382B coated respectively to in the R, G, B pixels has different viscosity (CP1>CP2>CP3), wherein the viscosity of the R-organic light emitting material 382R is CP1, the viscosity of the G-organic light emitting material 382G is CP2, and the viscosity of the B-organic light emitting material 382B is CP3. High viscosity means that the content of the solvent is low in the organic luminescent material, low viscosity means that the content of the solvent is high in the organic luminescent material, and the high content of the solvent means that it takes longer to dry under the same drying conditions in one embodiment.

Accordingly, in case where the viscosity CP1 of the R-organic light emitting material 382R is the largest, the viscosity CP2 of the G-organic light emitting material 382G is intermediate, and the viscosity CP3 of the B-organic light emitting material 382B is the smallest, the drying time of the R-organic light emitting material 382R is the shortest and the drying time of the B-organic light emitting material 382B is the longest, when the R-organic light emitting material 382R, G-organic light emitting material 382G, and B-organic light emitting material 382B are coated in the same thickness.

By controlling the drying time by the viscosity to compensate the difference in the drying time according to the coating thickness of the organic light emitting material 382R, 382G, and 382B, the thickness variation of the organic light emitting layer caused by the difference in coating thickness of the organic light emitting material 382R, 382G, and 382B can be minimized.

However, the organic light emitting material 382R, 382G, and 382B should be spread on the surface of the substrate after dropping thereto from the dispenser. If the viscosity of the organic light emitting material 382R, 382G, and 382B exceeds the set viscosity, the organic light emitting material 382R, 382G, and 382B cannot be dropped from the dispenser and cannot be spread on the substrate. In other word, since there is a process limitation in increasing the viscosity of the organic light emitting materials 382R, 382G, and 382B, there is a limit in compensating the difference in drying time according to the coating thickness of the organic light emitting material 382R, 382G, and 382B by controlling only the viscosity of the organic light emitting material 382R, 382G, and 382B.

In this embodiment, the drying time of the organic light emitting material 382R, 382G, and 382B is controlled equally by controlling the viscosity of the organic light emitting material 382R, 382G, and 382B and forming the inclined angle of the side surface of the second bank layer 344 for each pixel (θ"1>θ"2>θ"3). In this case, the dry surface areas b"1, b"2, and b"3 of the R, G, and B pixels are b"1>b"2>b"3. The inclined angle of the side surface of the second bank layer 144 is set based on only the thickness difference of the organic light emitting material coated in the R, G, B pixel in the first embodiment and the inclined angle of the side surface of the second bank layer 244 is set based on the thickness difference of the organic light emitting material and the difference of the luminescent area in the second embodiment, while the inclined angles θ1", θ2", and θ3" of the side surface of the second bank layer 344 is set based on the thickness difference and the viscosity difference of the organic light emitting material in this embodiment. Considering the compensation of the drying time due to the viscosity difference of the organic light emitting material, the inclined angles θ"1, θ"2, and θ"3 of the side surfaces of the second bank layer 344 of this embodiment is set smaller than the inclined angles θ1, θ2, and θ3 of the side surfaces of the second bank layer of the first embodiment (θ"1<θ1, θ"2<θ2, θ"3<θ3).

At this time, the inclined angles θ"1, θ"2, and θ"3 of the side surfaces of the second bank layer 344 may be determined according to the coating thickness, viscosity, and drying conditions of the organic light emitting materials 382R, 382G, and 382B.

Furthermore, in this embodiment, in case where the R-organic light emitting material 382R, the G-organic light emitting material 382G, and the B-organic light emitting material 382B are respectively coated in the R-pixel, G-pixel, and B-pixel and the luminescent areas thereof are different (a1<a2<a3), the inclined angles θ"1, θ"2, and θ"3 of the side surfaces of the second bank layer 344 is set based on the thickness difference and the viscosity difference of the organic light emitting material.

As describe above, in the disclosure, the drying time of the R, G, B organic light emitting materials is controlled equally by controlling the inclined angle of the side surface of the second bank layer or the drying surface area in accordance with the coating thickness of the R,G,B organic light emitting material, so that the thickness of the organic light emitting layer formed in the R, G, and B pixels can be uniform.

Further, in the disclosure, the inclined angle of the side surface of the second bank layer or dry surface area are controlled in accordance with the coating thickness and/or the luminescent area and/or viscosity of the R,G,B organic light emitting materials, thereby the organic light emitting layer having uniform thickness can be formed.

Many details are set forth in the foregoing description but should be construed as illustrative of preferred embodiments rather than to limit the scope of the invention. Therefore, the invention should not be defined by the described embodiments, but should be defined by the claims and their equivalents.

What is claimed is:

1. An organic light emitting display device, comprising:
a first substrate;
a plurality of first bank layers arranged along a first direction and a second direction on the first substrate to define a plurality of pixels, where the first direction and the second direction are orthogonal;
a plurality of second bank layers disposed along the first direction on the plurality of first bank layers to divide pixel columns of different colors; and
an organic light emitting diode in each pixel, the organic light emitting diode including an organic light emitting layer having different thicknesses on different colored pixels,
wherein side surfaces of a second bank layer from the plurality of second bank layers adjacent to the pixel columns of different colors are inclined at an angle, the inclined angle thereof is dependent upon a thickness of the organic light emitting layer in the pixel,
wherein a first bank layer from the plurality of first bank layers is made of hydrophilic material and the second bank layer is made of hydrophobic material, and
wherein the inclined angle of the side surfaces of the second bank layer is inversely proportional to a size of a luminescent area of the pixel.

2. The organic light emitting display device of claim 1, wherein the pixels include red, green, and blue pixels, and a relationship of a thickness t1 of the organic light emitting layer in the red pixel, a thickness t2 of the organic light emitting layer in the green pixel, and a thickness t3 of the organic light emitting layer in the blue pixel is t1>t2>t3.

3. The organic light emitting display device of claim 1, wherein the second bank layer has a width smaller than that of a width of a first bank layer from the plurality of first bank layers to expose a part of the first bank layer, and the organic light emitting layer is disposed on the exposed part of the first bank layer.

4. The organic light emitting display device of claim 1, wherein the second bank layer has a same width as that of a width of a first bank layer from the plurality of first bank layers.

5. The organic light emitting display device of claim 1, wherein sizes of luminescent areas of pixels of different colors are different.

6. A method of fabricating an organic light emitting display device comprising:
forming a plurality of first bank layers along a first direction and a second direction on a substrate to define a plurality of pixels and a plurality of second bank layers along the first direction on the plurality of first bank layers to divide pixel columns of different colors, where the first direction and the second direction are orthogonal;
forming a first electrode in the pixel;
coating an organic light emitting material in each of the pixel columns; and
drying the organic light emitting material to form an organic light emitting layer,
wherein side surfaces of a second bank layer from the plurality of second bank layers adjacent to the pixel columns of different colors are inclined at an angle, the inclined angle thereof is dependent upon a thickness of the organic light emitting layer in the pixel, and
wherein coating the organic light emitting material includes coating respectively red organic light emitting material, green organic light emitting material, and blue organic light emitting material in the different pixel columns, a relationship between a coating thickness T1 of the red organic light emitting material, a coating thickness T2 of the green organic light emitting material, and a coating thickness T3 of the blue organic light emitting material is T1>T2>T3, and
wherein the organic light emitting material is melted in a solvent, and a relationship between a viscosity CP1 of the red organic light emitting material, a viscosity CP2 of the green organic light emitting material, and a viscosity CP3 of the blue organic light emitting material is CP1>CP2>CP3.

7. The method of claim 6, wherein the inclined angle of the side surface of the second bank layer is dependent upon the thickness and the viscosity of the organic light emitting material in pixel.

8. The method of claim 6, wherein sizes of luminescent areas of pixels of different colors are different.

9. The method of claim 8, wherein the inclined angle of the side surface of the second bank layer is dependent upon the thickness of the organic light emitting layer and a size of the luminescent area in the pixel.

10. The method of claim 8, wherein the inclined angle of the side surface of the second bank layer is inversely proportional to a size of the luminescent area of the pixel.

11. An organic light emitting display device, comprising:
a first substrate;
a plurality of first bank layers arranged along a first direction and a second direction on the first substrate to define a plurality of pixels, where the first direction and the second direction are orthogonal;
a plurality of second bank layers disposed along the first direction on the plurality of first bank layers to divide pixel columns of different colors; and
an organic light emitting diode in each pixel, the organic light emitting diode including an organic light emitting layer having different thicknesses on different colored pixels, and the organic light emitting layer corresponding to the different colored pixels including organic light emitting material having different viscosities,
wherein side surfaces of a second bank layer from the plurality of second bank layers adjacent to the pixel columns of different colors are inclined at an angle, the inclined angle thereof is dependent upon a thickness of the organic light emitting layer and a viscosity of the organic light emitting material in the pixel.

* * * * *